United States Patent
Johansson et al.

(10) Patent No.: US 9,386,240 B1
(45) Date of Patent: Jul. 5, 2016

(54) COMPENSATION FOR DUAL CONVERSION GAIN HIGH DYNAMIC RANGE SENSOR

(71) Applicant: OMNIVISION TECHNOLOGIES, INC., Santa Clara, CA (US)

(72) Inventors: Robert Johansson, Oslo (NO); Trygve Willassen, Oppegaard (NO)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 14/656,341

(22) Filed: Mar. 12, 2015

(51) Int. Cl.
*H04N 5/341* (2011.01)
*H04N 3/14* (2006.01)
*H04N 5/378* (2011.01)
*H04N 5/347* (2011.01)
*H04N 5/3745* (2011.01)
*H04N 5/355* (2011.01)
*H03M 1/46* (2006.01)

(52) U.S. Cl.
CPC .............. *H04N 5/341* (2013.01); *H03M 1/466* (2013.01); *H04N 3/155* (2013.01); *H04N 5/347* (2013.01); *H04N 5/3559* (2013.01); *H04N 5/378* (2013.01); *H04N 5/37452* (2013.01); *H04N 5/37455* (2013.01)

(58) Field of Classification Search
None
See application file for complete search history.

(56) References Cited

U.S. PATENT DOCUMENTS

| | | | | |
|---|---|---|---|---|
| 8,294,077 B2* | 10/2012 | Mao | ................... | H04N 5/35509 250/208.1 |
| 2008/0055432 A1* | 3/2008 | Koseki | ................. | H04N 5/3658 348/241 |
| 2009/0237540 A1* | 9/2009 | Johnson | ............ | H01L 27/14609 348/308 |
| 2011/0102217 A1* | 5/2011 | Hsu | ...................... | H03M 1/1042 341/120 |
| 2012/0249851 A1* | 10/2012 | Martinussen | .......... | H04N 5/378 348/308 |
| 2013/0194118 A1* | 8/2013 | Coln | ................... | H03M 1/0682 341/155 |
| 2015/0070544 A1* | 3/2015 | Smith | ............... | H01L 27/14641 348/297 |
| 2015/0229859 A1* | 8/2015 | Guidash | ................. | H04N 5/374 348/308 |
| 2015/0280727 A1* | 10/2015 | Lien | .................... | H03M 1/1215 341/118 |
| 2015/0372691 A1* | 12/2015 | Mandal | ............... | H03M 1/1245 341/110 |
| 2016/0028985 A1* | 1/2016 | Vogelsang | ........ | H01L 27/14641 348/294 |
| 2016/0112665 A1* | 4/2016 | Meynants | ............ | H04N 5/3741 250/208.1 |

OTHER PUBLICATIONS

U.S. Appl. No. 14/554,787, filed Nov. 26, 2014, Johannes Solhusvik.
U.S. Appl. No. 14/555,062, filed Nov. 26, 2014, Robert Johansson.

* cited by examiner

*Primary Examiner* — Shahbaz Nazrul
(74) *Attorney, Agent, or Firm* — Blakely Sokoloff Taylor & Zafman LLP

(57) ABSTRACT

An image sensor, readout circuitry for an image sensor, and a method of operating readout circuitry are disclosed. Readout circuitry includes an analog-to-digital-converter ("ADC") including input stage circuitry with a first selectable input and a second selectable input. The ADC is coupled to sequentially receive a first reset signal, a second reset signal, a high gain image signal, and a low gain image signal, in that order. The input stage circuitry is configured to select the first selectable input when receiving the first reset signal and the low gain image signal and select the second selectable input when receiving the second reset signal and the high gain image signal.

19 Claims, 5 Drawing Sheets

COMPENSATION FOR DUAL CONVERSION GAIN HIGH DYNAMIC RANGE SENSOR

TECHNICAL FIELD

This disclosure relates generally to optics, and in particular to high dynamic range sensors.

BACKGROUND INFORMATION

Standard image sensors have a limited dynamic range of approximately 60 to 70 dB. However, the luminance dynamic range of the real world is much larger. Natural scenes often span a range of 90 dB and over. In order to capture the highlights and shadows simultaneously, high dynamic range ("HDR") technologies have been used in image sensors to increase the captured dynamic range. The most common techniques to increase dynamic range is to merge multiple exposures captured with standard (low dynamic range) image sensors into a single linear HDR image, which has much larger dynamic range than a single exposure image.

One of the most common HDR sensor solutions would be having multiple exposures into one single image sensor. With different exposure integration times or different sensitivities (for example by inserting neutral density filters), one image sensor could have 2, 3, 4 or even more different exposures in a single image sensor. Multiple exposure images are available in a single shot using this HDR image sensor. However, overall image resolution is decreased using this HDR sensor compared to a normal full resolution image sensor. For example, for an HDR sensor that combines 4 different exposures in one image sensor, each HDR image would be only a quarter resolution of the full resolution image. Hence, improved HDR imaging technologies including new pixel and readout architectures and techniques are desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an image sensor and a method of reading out a pixel array of an image sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
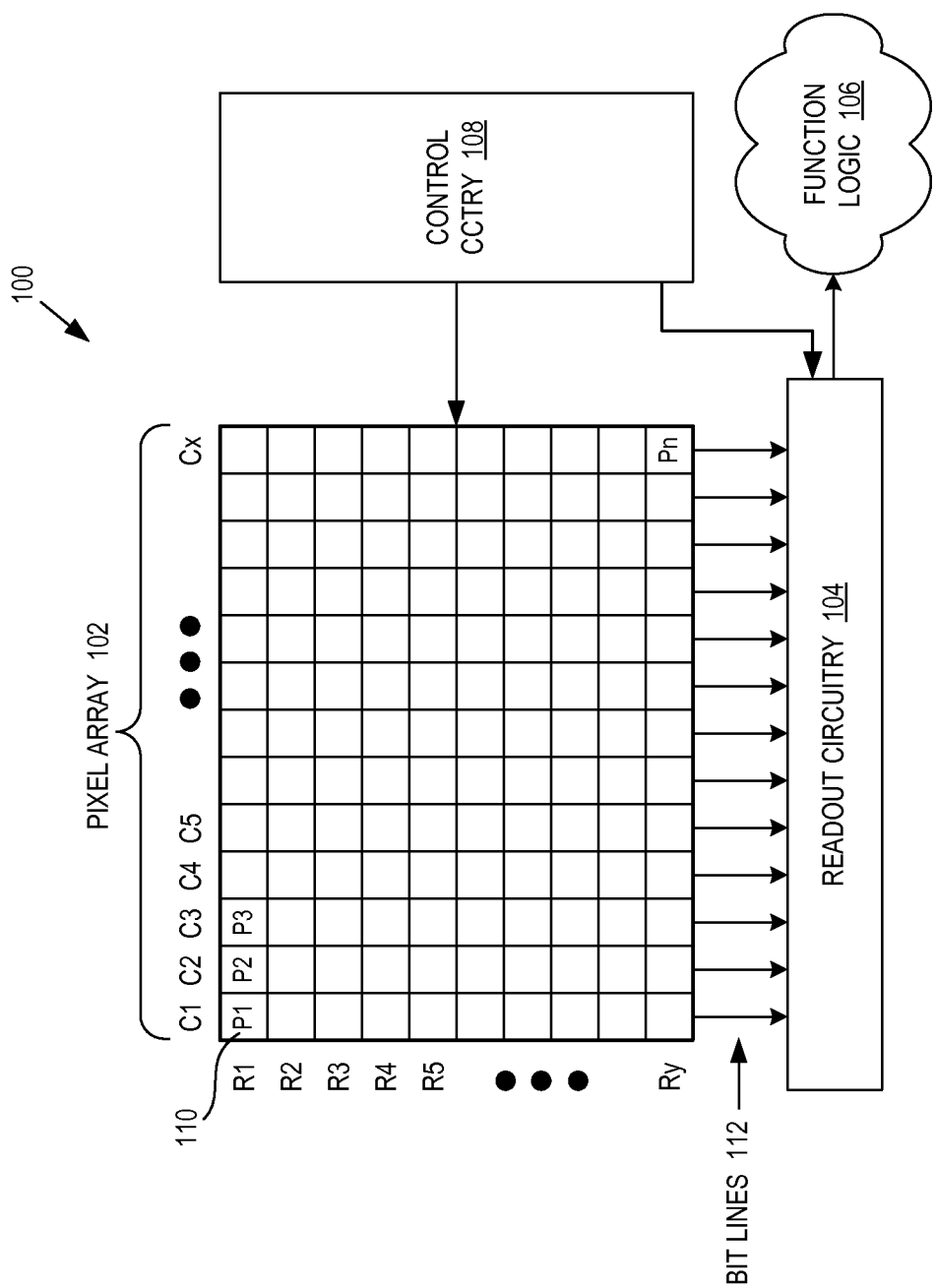
FIG. 1 is a block diagram schematic illustrating one example of an imaging system that includes a high dynamic range ("HDR") pixel array and readout circuitry coupled to readout the HDR pixel array, in accordance with an embodiment of the disclosure.

FIG. 1 is a block diagram schematic illustrating one example of an imaging system 100 that includes a high dynamic range ("HDR") pixel array 102 and readout circuitry 104 coupled to readout HDR pixel array 102, in accordance with an embodiment of the disclosure. Imaging system 100 includes HDR pixel array 102, control circuitry 108, readout circuitry 104, and function logic 106. As shown in the depicted example, HDR pixel array 102 is coupled to control circuitry 108 and readout circuitry 104. Readout circuitry 104 is coupled to function logic 106. Control circuitry 108 is coupled to pixel array 102 to control operational characteristics of HDR pixel array 102 in order to capture HDR images generated by image light received by HDR pixel array 102. For example, control circuitry 108 may generate a shutter signal or a plurality of shutter signals for controlling image acquisition. Control circuitry 108 is also coupled to readout circuitry 104 so that control circuitry 108 can coordinate image acquisitions of HDR pixel array 102 with reading out HDR pixel array 102.

In one example, HDR pixel array 102 is a two-dimensional (2D) array of HDR pixels 110 (e.g., pixels P1, P2 . . . , Pn). In one example, each HDR pixel 110 is read out with dual conversion gain to achieve HDR imaging. As illustrated, each HDR pixel 110 is arranged into a row (e.g., rows R1 to Ry) and a column (e.g., column C1 to Cx) to acquire image data of a person, place, object, etc., which can then be used to render an image of the person, place, object, etc.

In one example, after each HDR pixel 110 has acquired its image data or image charge, the image data is read out by readout circuitry 104 through bit lines 112 (which may be column lines) and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines.

Figure 2:
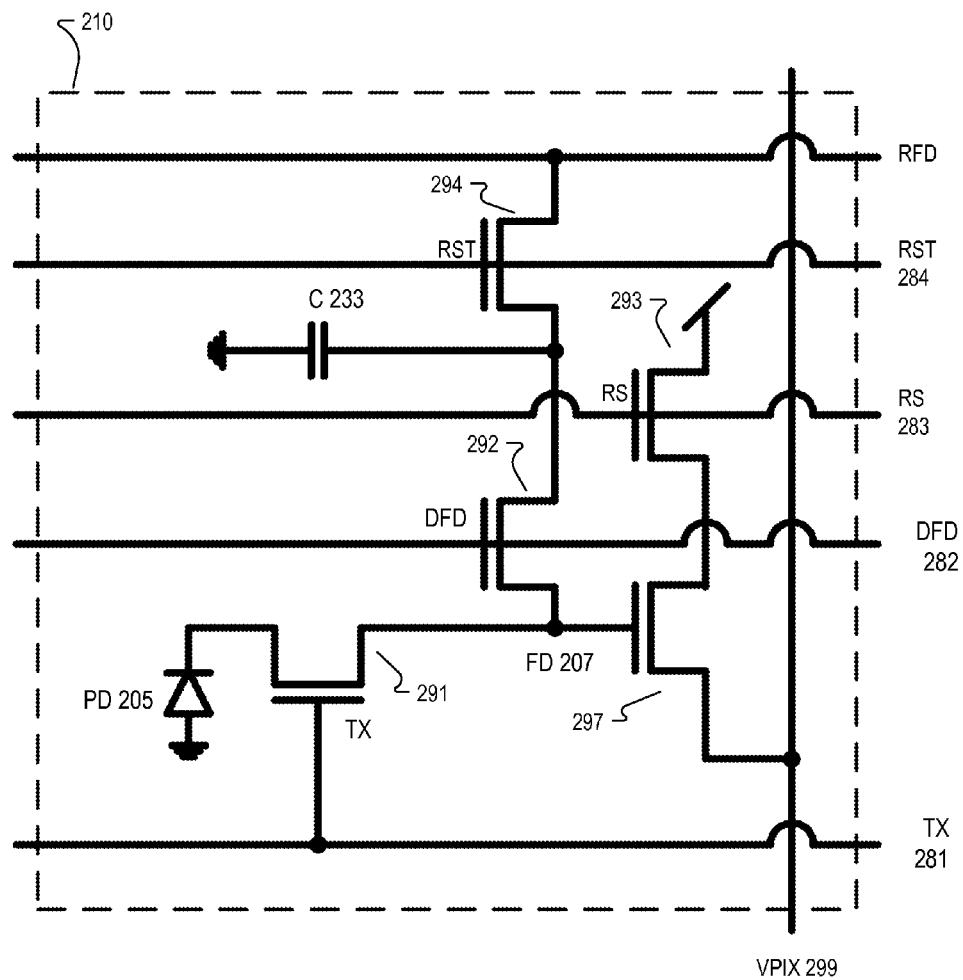
FIG. 2 is an example schematic of an HDR image pixel, in accordance with an embodiment of the disclosure.

FIG. 2 is an example schematic of an HDR image pixel 210 that is read out with dual conversion gain to achieve HDR imaging in accordance with the teachings of the present invention. It is noted that pixel 210 of FIG. 2 may be an example one of the pixels 110 of FIG. 1. In FIG. 2, pixel 210 includes a photodetector PD 205 coupled to a transfer transistor 291 that is coupled to be controlled by a TX signal 281. Transfer transistor 291 is coupled to a floating diffusion (FD) node 207.

In the depicted example, the floating diffusion (FD) node 207 is coupled to be reset to a RFD signal voltage through a reset transistor 294 and a DFD transistor 292. In the illustrated example, reset transistor 294 is coupled to be controlled in response to an RST signal 284, and DFD transistor 292 is coupled to be controlled in response to a DFD signal 282. The example illustrated in FIG. 2 also illustrates that an in-pixel capacitor C 233 is coupled to the floating diffusion (FD) node through DFD transistor 292 in response to DFD signal 282. In other words, when DFD signal 282 activates DFD transistor 292, floating diffusion node 207 has increased capacitance.

Continuing with the example depicted in FIG. 2, floating diffusion node 207 is also coupled to the control terminal of an amplifier transistor 297, which in FIG. 2 is the source follower (SF) coupled transistor having its gate terminal coupled to the floating diffusion (FD) node. In the depicted example, a row select transistor 293, which is controlled with the RS signal 283, is coupled between a voltage source terminal and the drain terminal of the source follower (SF) transistor 297. In the depicted example, the source terminal of the source follower (SF) transistor is coupled to the VPIX output 299, which is the output bitline of pixel 210, and through which the output signals of pixel 210 are read out.

In operation, while PD 205 accumulates image charge in response to incident image light, floating diffusion 207 is reset by enabling transistor DFD 292 and enabling reset transistor 294. Then, a first reset signal of FD 207 is transferred onto VPIX 299 while transistor DFD 292 is enabled (and transistor RST 294 is disabled). When DFD 292 is enabled, FD 207 is coupled to capacitor 233 and thus the first reset signal is readout at a low conversion gain. Transistor DFD 292 is then disabled to decouple capacitor 233 from FD 207. With capacitor 233 decoupled from FD 207, a second reset signal of FD 207 is transferred onto VPIX 299. Since FD 207 is decoupled from capacitor 233 when the second reset signal is transferred onto VPIX 299, the second reset signal is readout at a high conversion gain.

After the first and second reset signals are readout, transfer transistor 291 is enabled (pulsed) to transfer image charge accumulated in PD 205 from PD 205 to FD 207. A high gain image signal associated with the image charge in FD 207 is transferred onto VPIX 299 while transistor DFD is disabled, meaning the high conversion image signal associated with the image charge in FD 207 is sampled at the high conversion gain. Then, transistor DFD 292 is enabled to couple capacitor 233 to FD 207. While capacitor 233 is coupled to FD 207, a low gain image signal associated with the image charge in FD 207 is transferred onto VPIX 299, meaning the low gain image signal associated with the image charge in FD 207 is sampled at the low conversion gain. As described above, pixel 210 sequentially generates a first reset signal (at a low conversion gain), a second reset signal (at a high conversion gain), a high gain image signal (at the high conversion gain), and a low gain image signal (at the low conversion gain), in that order.

Figure 3A:
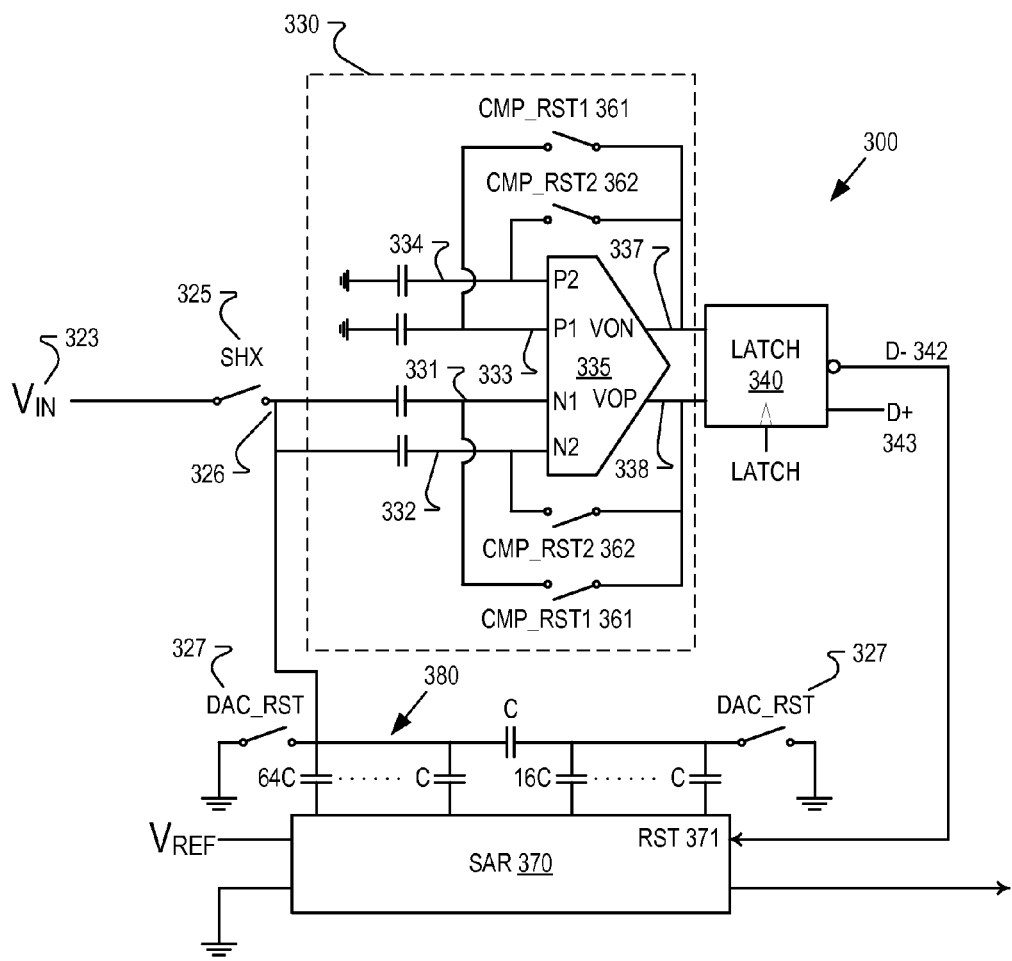
FIG. 3A illustrates an example Analog-to-Digital Converter ("ADC") including input stage circuitry coupled to receive signals from the HDR image pixel of FIG. 2, in accordance with an embodiment of the disclosure.

FIG. 3A illustrates an example Analog-to-Digital Converter ("ADC") 300 including input stage circuitry 330 coupled to receive signals from HDR image pixel 210, in accordance with an embodiment of the disclosure. The first reset signal, the second reset signal, the high gain image signal, and the low gain image signal are received by ADC 300 on $V_{IN}$ 323. VPIX 299 may be directly coupled to $V_{IN}$ 323. Sample-and-Hold Switch SHX 325 opens and closes to sample the signals onto inputs of input stage circuitry 330. Input stage circuitry 330 includes a differential amplifier 335 having a first input N1 331, a second input N2 332, a third input P1 333, and a fourth input P2 334. The outputs of different amplifier 335 are VON 337 and VOP 338. Latch 340 is coupled to generate outputs D− 342 and D+ 342 in response to receiving VON 337 and VOP 338 from differential amplifier 335. A successive-approximation-register ("SAR") 370 is coupled to be reset at reset node 371 in response to receiving a digital high signal on D− 342. SAR 370 is coupled to a binary-weighted capacitor array 380 which is coupled to input node 326, which is coupled to the first input 331 and second input 332 of input stage circuitry 330 via capacitors.

Figure 3C:
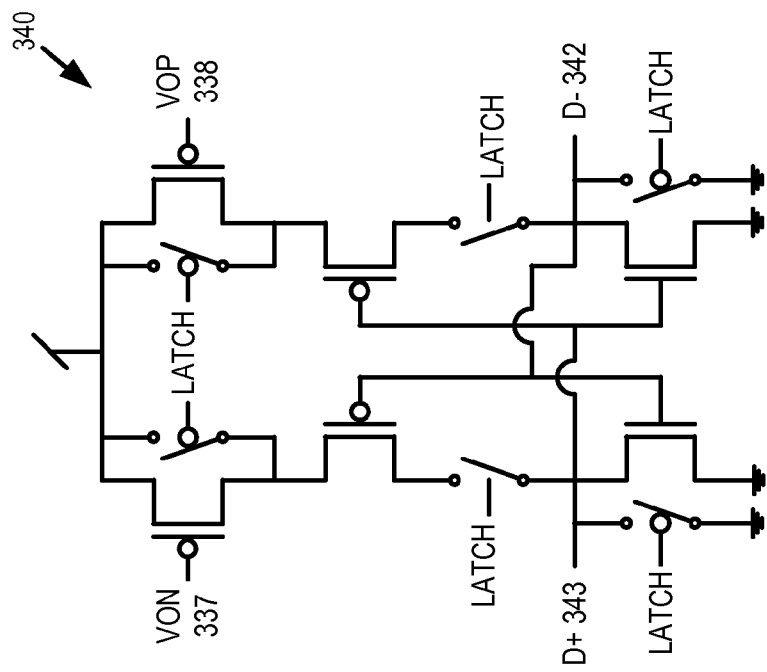
FIG. 3C includes an example regenerative latch for coupling to the differential amplifier of FIG. 3B, in accordance with an embodiment of the disclosure.
Figure 3B:
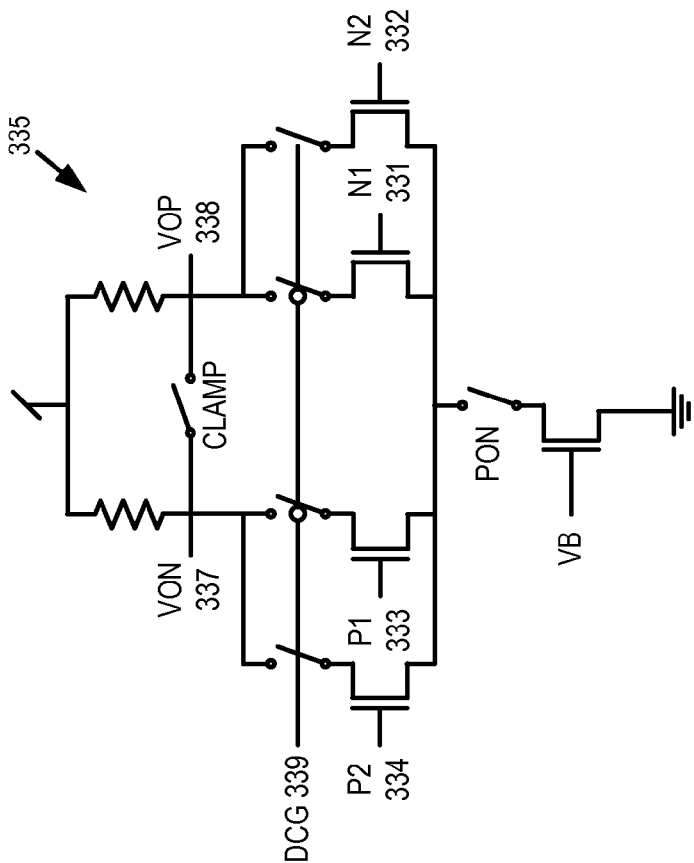
FIG. 3B illustrates an example differential amplifier having selectable inputs, in accordance with an embodiment of the disclosure.

FIG. 3B illustrates an example differential amplifier 335 having selectable inputs, in accordance with an embodiment of the disclosure. When signal DCG 339 is digital low, the switches above inputs N1 331 and P1 333 are closed and differential amplifier amplifies the signals on inputs N1 331 and P1 333. Inputs N1 331 and P1 333 are the first pair of inputs of differential amplifier 335. When signal DCG 339 is digital high, the switches above inputs N2 332 and P2 334 are closed and differential amplifier amplifies the signals on inputs N2 332 and P2 334. Inputs N2 332 and P2 334 are the second pair of inputs of differential amplifier 335.

FIG. 3C includes an example regenerative latch 340 for coupling to differential amplifier 335, in accordance with an embodiment of the disclosure. Regenerative latch 340 is coupled to generate outputs D− 342 and D+ 342 in response receiving to VON 337 and VOP 338 from differential amplifier 335. Regenerative latch 340 has 12-bit resolution, in one embodiment.

Figure 4:
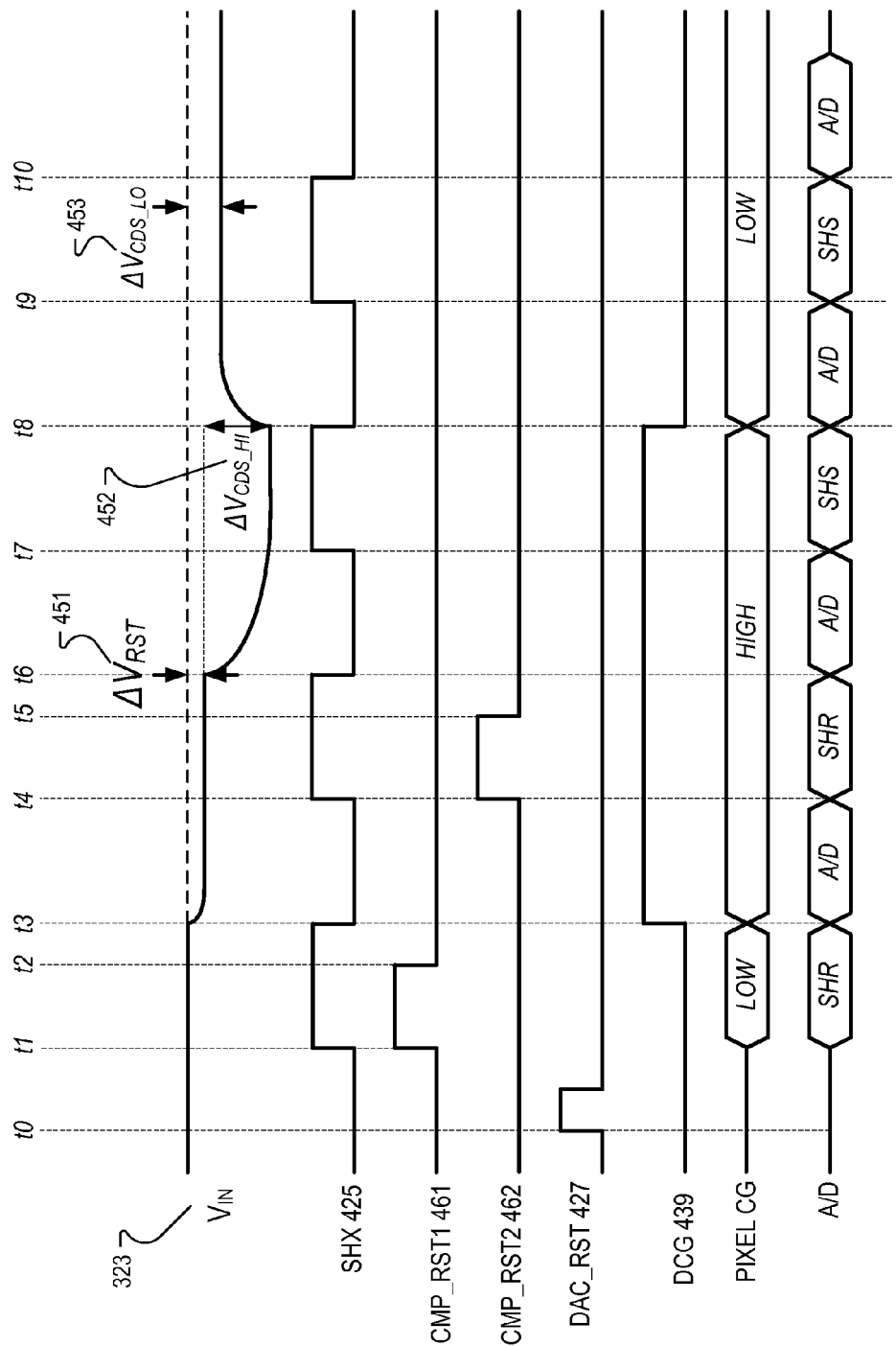
FIG. 4 shows a timing diagram for operating the ADC of FIG. 3A, in accordance with an embodiment of the disclosure.

FIG. 4 shows a timing diagram for operating ADC 300, in accordance with an embodiment of the disclosure. The signals shown in FIG. 4 may be controlled by control circuitry 108 and/or by readout circuitry 104. At time t0, DAC_RST 327 is pulsed to reset/discharge the binary-weight capacitor array 380. At time t1, SHX 425 goes high which closes the SHX gate 325 and samples the first reset signal (generated at the low conversion gain) from $V_{IN}$ 323 onto input node 326. Also at time t1, CMP_RST1 461 signal goes high, which closes the CMP_RST1 361 gates and resets the voltage of inputs N1 331 and P1 333 to the outputs VON 337 and VOP 338, respectively. Since signal DCG 439 is low, inputs N1 331 and P1 333 are the active inputs of differential amplifier 335 at time t1. At time t2, CMP_RST1 461 signal goes low, which opens the CMP_RST1 361 switches and differential amplifier amplifies the first reset signal (generated at the low conversion gain) on input N1 331 onto its outputs and the amplified version of the first reset signal is set on regenerative latch 340 for comparison and digital conversion by the ADC. At time t3, signal SHX 425 goes low, which closes the SHX gate 325. Also at time t3, signal DCG 439 goes high which switches the inputs of differential amplifier 335 from N1 331 and P1 333 (the first pair of inputs) to N2 332 and P2 334 (the second pair of inputs).

At time t4, SHX 425 goes high again which closes the SHX gate 325 and samples the second reset signal (generated at the high conversion gain) from $V_{IN}$ 323 onto input node 326. Also at time t4, CMP_RST2 462 signal goes high, which closes the CMP_RST2 362 gates and resets the voltage of inputs N2 332 and P2 334 to the outputs VON 337 and VOP 338, respectively. At time t5, CMP_RST2 462 signal goes low, which opens the CMP_RST2 362 switches and differential amplifier amplifies the second reset signal (generated at the high conversion gain) on input N2 333 onto its outputs and the amplified version of the second reset signal is set on regenerative latch 340 for comparison and digital conversion by the ADC. At time t6, signal SHX 425 goes low, which closes the SHX gate 325. Thus, ADC 300 has the advantage of having a duplicated input stage in input stage circuitry 330, which enables the two reset levels at both the high and low conversion gain to be sampled. The duplicated input stage is made possible by having differential amplifier 335 include selectable inputs since signal DCG 439 selects between a first pair of inputs (N1 331 and P1 333) and a second pair of inputs (N2 332 and P2 334).

At time t7, SHX 425 goes high again which closes the SHX gate 325 and samples the high gain image signal (generated at the high conversion gain) from $V_{IN}$ 323 onto input node 326. Since DCG 439 is still high, the second pair of inputs N2 332 and P2 334 are still the active inputs of differential amplifier 335. Differential amplifier 335 amplifies the high gain image signal (generated at the high conversion gain) on input N2 333 onto its outputs and the amplified version of the high gain reset signal is set on regenerative latch 340 for comparison and digital conversion by the ADC. At time t8, signal SHX 425 goes low, which closes the SHX gate 325.

Also at time t8, DCG 439 goes low, which selects the first pair of inputs N1 331 and P1 333 as the active inputs of differential amplifier 335. At time t9, SHX 425 goes high again which closes the SHX gate 325 and samples the low gain image signal (at the low conversion gain) from $V_{IN}$ 323 onto input node 326. Differential amplifier 335 amplifies the low gain image signal (generated at the low conversion gain) on input N1 331 onto its outputs and the amplified version of the low gain reset signal is set on regenerative latch 340 for comparison and digital conversion by the ADC. At time t10, signal SHX 425 goes low, which closes the SHX gate 325.

As shown in FIG. 4, the difference between the first reset voltage and the second reset voltage is $\Delta V_{RST}$ 451. The correlated double sampling ("CDS") value at the high conversion gain of pixel 210 is shown as $\Delta V_{CDS\_HI}$ 452 while the CDS value at the low conversion gain of pixel 210 is shown as $\Delta V_{CDS\_LO}$ 453. $\Delta V_{CDS\_LO}$ 453 can be multiplied by the low conversion gain to generate the digital image signal of pixel 210 at the low conversion gain while $\Delta V_{CDS\_HI}$ 452 can be multiplied by the high conversion gain to generate the digital image signal of pixel 210 at the high conversion gain.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor comprising:
   a pixel array;
   control circuitry coupled to the pixel array for facilitating image acquisitions, wherein pixels in the pixel array are configured to sequentially generate a first reset signal at a first conversion gain, a second reset signal at a second conversion gain that is larger than the first conversion gain, a high gain image signal at the second conversion gain, and a low gain image signal at the first conversion gain, in that order; and
   a successive-approximation-register ("SAR") analog-to-digital-converter ("ADC") including input stage circuitry with a first selectable input and a second selectable input, wherein the SAR ADC is coupled to sequentially receive the first reset signal, the second reset signal, the high gain image signal, and the low gain image signal, in that order, and wherein the input stage circuitry is configured to select the first selectable input when receiving the first reset signal and the low gain image signal and configured to select the second selectable input when receiving the second reset signal and the high gain image signal.

2. The image sensor of claim 1, wherein the input stage circuitry includes a differential amplifier that includes the first and second selectable inputs.

3. The image sensor of claim 2, wherein the first selectable input is included in a first pairs of selectable inputs and the second selectable input is included in a second pair of selectable inputs, and wherein the first pair of selectable inputs is coupled to be reset by a first reset signal, the second pair of selectable inputs being coupled to be reset by a second reset signal separate from the first reset signal.

4. The image sensor of claim 1, wherein the SAR ADC includes:
   a binary-weighted capacitor array coupled to an input node, wherein the first selectable input and the second selectable input are also coupled to the input node, and wherein the input node is coupled to a sample-and-hold switch; and
   a successive-approximation-register ("SAR") coupled to the binary-weighted capacitor array.

5. The image sensor of claim 4, wherein the SAR ADC includes:
   a regenerative latch coupled between an output of the input stage circuitry and an input of the SAR.

6. The image sensor of claim 1, wherein the pixel array includes pixels arranged in rows and columns.

7. The image sensor of claim 1, wherein the image sensor includes a plurality of the SAR ADCs and wherein each SAR ADC in the plurality is coupled to its own column of the pixel array.

8. The image sensor of claim 1, wherein the input stage circuitry is configured to sequentially output the first reset signal, the second reset signal, a difference between the second reset signal and the low gain image signal, and a difference between the first reset signal and the high gain image signal, in that order, in response to sequentially receiving the first reset signal, the second reset signal, the high gain image signal, and the low gain image signal, in that order.

9. A readout circuit for an image sensor, the readout circuit comprising:

a plurality of successive-approximation-register ("SAR") analog-to-digital-converters ("ADCs") including input stage circuitry with a first selectable input and a second selectable input, wherein the SAR ADC is coupled to sequentially receive a first reset signal, a second reset signal, a high gain image signal, and a low gain image signal, in that order, and wherein the input stage circuitry is configured to select the first selectable input when receiving the first reset signal and the low gain image signal and configured to select the second selectable input when receiving the second reset signal and the high gain image signal, wherein input stage circuitry is for coupling to bitlines of a pixel array, and wherein each SAR ADC in the plurality includes an output for transmitting a digital conversion of the first reset signal, the second reset signal, the high gain image signal, and the low gain image signal.

10. The readout circuit of claim 9, wherein the input stage circuitry includes a differential amplifier that includes the first and second selectable inputs.

11. The readout circuit of claim 10, wherein the first selectable input is included in a first pairs of selectable inputs and the second selectable input is included in a second pair of selectable inputs, and wherein the first pair of selectable inputs is coupled to be reset by a first reset signal, the second pair of selectable inputs being coupled to be reset by a second reset signal separate from the first reset signal.

12. The readout circuit of claim 9, wherein each SAR ADC in the plurality includes:
a binary-weighted capacitor array coupled to an input node, wherein the first selectable input and the second selectable input are also coupled to the input node, and wherein the input node is coupled to a sample-and-hold switch; and
a successive-approximation-register ("SAR") coupled to the binary-weighted capacitor array.

13. The readout circuit of claim 12, wherein the SAR ADC includes:
a regenerative latch coupled between an output of the input stage circuitry and an input of the SAR.

14. A method comprising:
sequentially receiving at input stage circuitry, a first reset signal, a second reset signal, a high gain image signal, and a low gain image signal, in that order, wherein the first reset signal and the low gain image signal are generated by an image sensor pixel at a first conversion gain, and wherein the second reset signal and the high gain image signal are generated by the image sensor pixel at a second conversion gain that is greater than the first conversion gain;
selecting a first selectable input of the input stage circuitry to amplify and output for comparison by an analog-to-digital-converter ("ADC") when the first reset signal and the low gain image signal are received by the input stage circuitry; and
selecting a second selectable input of the input stage circuitry to amplify and output for comparison by the ADC when the second reset signal and the high gain image signal are received by the input stage circuitry.

15. The method of claim 14, wherein the input stage circuitry includes a differential amplifier that includes the first and second selectable inputs.

16. The method of claim 15 further comprising:
resetting a first pair of selectable inputs before receiving the second reset signal and not resetting the first pair of selectable inputs between receiving the second reset signal and receiving the low gain image signal, wherein the first selectable input is included in the first pairs of selectable inputs; and
resetting a second pair of selectable inputs after receiving the first reset signal and not resetting the second pair of selectable inputs between receiving the high gain image signal and receiving the low gain image signal, wherein the second selectable input is included in the second pair of selectable inputs; and wherein the second pair of selectable inputs is coupled to be reset by a second reset signal separate from the first reset signal.

17. The method of claim 14, wherein the ADC is a successive-approximation-register ("SAR") ADC and the SAR ADC includes:
a binary-weighted capacitor array coupled to an input node, wherein the first selectable input and the second selectable input are also coupled to the input node, and wherein the input node is coupled to a sample-and-hold switch; and
a successive-approximation-register ("SAR") coupled to the binary-weighted capacitor array.

18. The method of claim 17, wherein the ADC includes:
a regenerative latch coupled between an output of the input stage circuitry and an input of the SAR.

19. The method of claim 14, wherein an image sensor arranged in rows and columns of the image sensor pixels includes a plurality of the input stage circuitry, and wherein each row or column of the image sensor is coupled to an input stage circuitry in the plurality of input stage circuitry.

* * * * *